United States Patent [19]

Narasimhan

[11] Patent Number: 6,080,477
[45] Date of Patent: *Jun. 27, 2000

[54] TITANIUM CARBONITRIDE COATED STRATIFIED SUBSTRATE AND CUTTING INSERTS MADE FROM THE SAME

[75] Inventor: Krishnan Narasimhan, Birminghan, Mich.

[73] Assignee: Valenite Inc., Madison Heights, Mich.

[*] Notice: This patent issued on a continued prosecution application filed under 37 CFR 1.53(d), and is subject to the twenty year patent term provisions of 35 U.S.C. 154(a)(2).

[21] Appl. No.: 08/861,993

[22] Filed: May 22, 1997

Related U.S. Application Data

[62] Division of application No. 07/753,456, Sep. 3, 1991, Pat. No. 5,665,431.

[51] Int. Cl.$^7$ ....................................................... B32B 9/00
[52] U.S. Cl. ........................ 428/336; 428/212; 428/457; 428/469; 428/472; 428/697; 428/698
[58] Field of Search ................................... 428/697, 698, 428/457, 469, 472, 336, 216, 212

[56] References Cited

U.S. PATENT DOCUMENTS

| | | | |
|---|---|---|---|
| 3,771,976 | 11/1973 | Wakefield | 29/194 |
| 3,813,969 | 6/1974 | Wheeler . | |
| 4,035,541 | 7/1977 | Smith et al. | 428/217 |
| 4,049,876 | 9/1977 | Yamamoto et al. | 428/932 |
| 4,150,195 | 4/1979 | Tobioka et al. | 428/548 |
| 4,162,338 | 3/1989 | Schintlmeister . | |
| 4,409,003 | 10/1983 | Sarin . | |
| 4,442,169 | 4/1984 | Graham . | |
| 4,497,874 | 2/1985 | Hale | 428/551 |
| 4,610,931 | 9/1986 | Nemeth et al. | 75/240 |
| 4,708,037 | 11/1987 | Buljan et al. | 428/698 |
| 4,812,370 | 3/1989 | Okada et al. | 428/552 |
| 4,830,886 | 5/1989 | Cho et al. | 427/249 |
| 5,066,553 | 11/1991 | Yoshimura et al. | 428/698 |
| 5,093,151 | 3/1992 | Van den Berg . | |
| 5,106,674 | 4/1992 | Okada et al. | 428/697 |
| 5,181,953 | 1/1993 | Nakano et al. | 75/237 |
| 5,266,388 | 11/1993 | Santhanam et al. | 428/212 |

FOREIGN PATENT DOCUMENTS

| | | |
|---|---|---|
| 0032887 | 7/1981 | European Pat. Off. . |
| 0 337 696 | 10/1989 | European Pat. Off. . |
| 0347399 | 12/1989 | European Pat. Off. . |
| 0440157 | 8/1991 | European Pat. Off. . |
| 2384576 | 10/1978 | France . |

OTHER PUBLICATIONS

English translation of JP 60–25,605.
English translation of JP 10491–1979.
Abstract of German Patent No. 2113853 to Deutsche Edelstahlwerke A.
Abstract of German Patent No. DD–145,930 — Jan. 14, 1981 — Leonhardt, et al.
Abstract of Japanese Patent No. 51–066289 — Jun. 8, 1976— Hara.
Abstract of Jaroslav Hofmann, Konf. Praskovej Metal., [Zb. Prednasok], 5th (1978), Vol. 1, 183–92 Publisher: Slov, Akad, Vied, Ustav Exp. Metal., Kosice, Czech. Coden: 42SXAN.

*Primary Examiner*—Archene Turner
*Attorney, Agent, or Firm*—Mary K. Cameron

[57] ABSTRACT

A process for forming a titanium carbonitride coated stratified cobalt enriched cemented carbide cutting insert, said cemented carbide is comprised of more than 70 percent by weight tungsten carbide and has a matrix binder comprising cobalt with a cobalt enriched stratified surface. The process comprises chemically vapor depositing a layer of titanium carbonitride on said cemented carbide substrate by heating gaseous reactants comprising titanium chloride, methane, hydrogen, and nitrogen with an optimum methane/nitrogen ratio, under suitable conditions to form a titanium carbonitride coated insert having an eta phase in the cemented carbide substrate adjacent said titanium carbonitride coating. The eta phase comprises chemical compounds consisting essentially of cobalt, tungsten and carbon, and the titanium carbonitride surface is contacted with a carburizing gas for a sufficient time and at a sufficient temperature to convert substantially all of said eta phase to elemental cobalt and tungsten carbide.

22 Claims, 1 Drawing Sheet

TITANIUM CARBONITRIDE COATED STRATIFIED SUBSTRATE AND CUTTING INSERTS MADE FROM THE SAME

This application is a division of application Ser. No. 07/753,456, filed Sep. 3, 1991, now U.S. Pat. No. 5,665,431.

BACKGROUND OF THE INVENTION

1. Field of the Invention

The present invention relates to stratified cobalt enriched cemented carbide cutting tools having adherent coatings of titanium carbonitride and process for deposition of those coatings.

2. Description of the Related Art

Cemented carbide cutting tools are widely used in metal cutting applications owing to their unique properties of high hardness, toughness, strength, and wear resistance of cemented carbide materials can be further improved by applying a thin layer of a coating of a refractory compound such as titanium carbide, titanium nitride, aluminum oxide, and combinations thereof. Such coatings have widened the application range of cemented carbide tools.

Advances in metal working equipment manufacture and economic necessities of higher productivity have combined to put greater demands of improved performance on the cutting tool materials.

Tungsten carbide based sintered alloys are used as substrate material for the coated cutting tools because of the high mechanical strength, hardness and good wear resistance. As a substrate material, the tungsten carbide based alloy has higher toughness than other materials such as titanium carbide based sintered alloys, titanium nitride based sintered alloys and alumina-based ceramics. However, when the tungsten carbide based substrates are coated with titanium carbide by chemical vapor deposition techniques, a brittle layer of a complex carbide, known as the eta phase, tends to form around the tungsten carbide grains. The brittle layer acts as a site initiating the propagation of cracks so that the cutting inserts with this deleterious complex exhibit a marked reduction in strength.

The deleterious effect of eta phase is described in the papers by Bhat, Cho and Woerner (Relationship between metal-cutting performance and material properties of TiC-coated cemented carbide cutting tools, Surface and Coatings Technology, Vol. 29, 1986, pp. 239–246; the role of interface development during chemical vapor deposition in the performance of TiC-coated cemented carbide cutting tools, Journal of Vacuum Science and Technology, Vol. A4(6), 1986, pp. 2713–2716).

Another problem encountered during vapor phase deposition is the diffusion of cobalt to the surface and into the TiCN coatings. One technique to avoid these problems is not to use titanium carbide. Several practitioners of the art resort to depositing a film of TiN on the surface first.

SUMMARY

Conventional coatings of TiCN on stratified cobalt surfaces using CVD techniques assume that the substrate surface is uniform and normalized. However, this is not the case. Stratified cobalt surfaces must undergo an electropolishing treatment, or other cobalt removal treatments to remove cobalt cap from the surface, and make it amenable for coating of Titanium compounds. This treatment presents an irregular surface to the coating with the cubic carbides at the surface presenting a random distribution, and the orientation of WC crystals, presenting crests and troughs at the surface, due to the varying removal rates of cobalt caps, at regions of high and low cobalt concentrations.

As per prior art, conventional CVD deposition of TiCN coating on carbide substrates, presents a problem due to the carbon contribution from the substrate. This is a reason why practitioners of this art deposit a normalizing layer initially consisting of TiC or TiN to stop the substrate contribution of carbon toward the TiCN layer deposition. The present invention allows the deposition of TiCN directly on a stratified cobalt enriched substrate without going through techniques of prior art.

The technique proposed here is the controlled deposition of a TiCN layer, with an optimum C/N ratio in the gas phase, followed by carbon correction treatment as in U.S. Pat. No. 4,830,886 incorporated herein by reference as if fully set forth. This controlled treatment results in a normalized surface, with the rearrangement of the cubic carbides at the surface, in a regular uniform fashion at the coating and substrate interface. (Reference—Fig. [1]). As a result of this normalized surface, the coating deposition is uniform, thereby promoting adhesion and other related properties of TiCN which is an improvement on TiC coating. The presence of the TiCN layer also minimizes the diffusion of cobalt in to the coating due to the presence of a tightly packed lattice, comprising of nitrogen and carbon in a solid solution. Thus the presence of a controlled TiCN layer, with a normalized and regular substrate surface, coupled with optimum properties of TiCN, results in a superior wear resistant coated tool.

The present invention relates to a process for forming a titanium carbonitride layer directly on the cemented carbide substrate without the presence of a deleterious eta phase. It is an object of the present invention to eliminate or reduce the presence of the eta phase from the coating/substrate interface region, and to eliminate porosity in the coating layer which is associated with the surface condition of the substrate.

It is a further object to achieve the above without sacrificing the advantageous properties of a titanium carbonitride coating for metal cutting applications.

Further, it is an object of the present invention to enhance one or some of the desirable properties, such as the adhesion of the coating. The present invention makes it possible to form a more uniform interface so that the final coating is uniform, thereby enhancing that life. Hence, the present invention is directed to an improved process for obtaining a coated substrate which obviates one or more disadvantages of prior processes.

In accordance with the present invention, there is provided process for making a cemented carbide cutting insert of the type comprising a substrate of tungsten carbide grains in a cobalt rich matrix having a layer of titanium carbonitride directly adjacent said substrate. The substrate directly adjacent said coating comprises tungsten carbide, and cubic carbides of the type (W, Ti) [C] in a form chemically unreacted with cobalt. More particularly, the substrate directly adjacent the coating is characterized by the absence of eta phase.

In accordance with the process of the present invention, the undesirable eta phase formed during the vapor phase deposition of TiCN or during the manufacture of the substrate is removed by a carbon correction cycle, which also leads to titanium carbonitride layer composition optimization.

DETAILED DESCRIPTION OF THE PREFERRED EMBODIMENT

Figure 1:
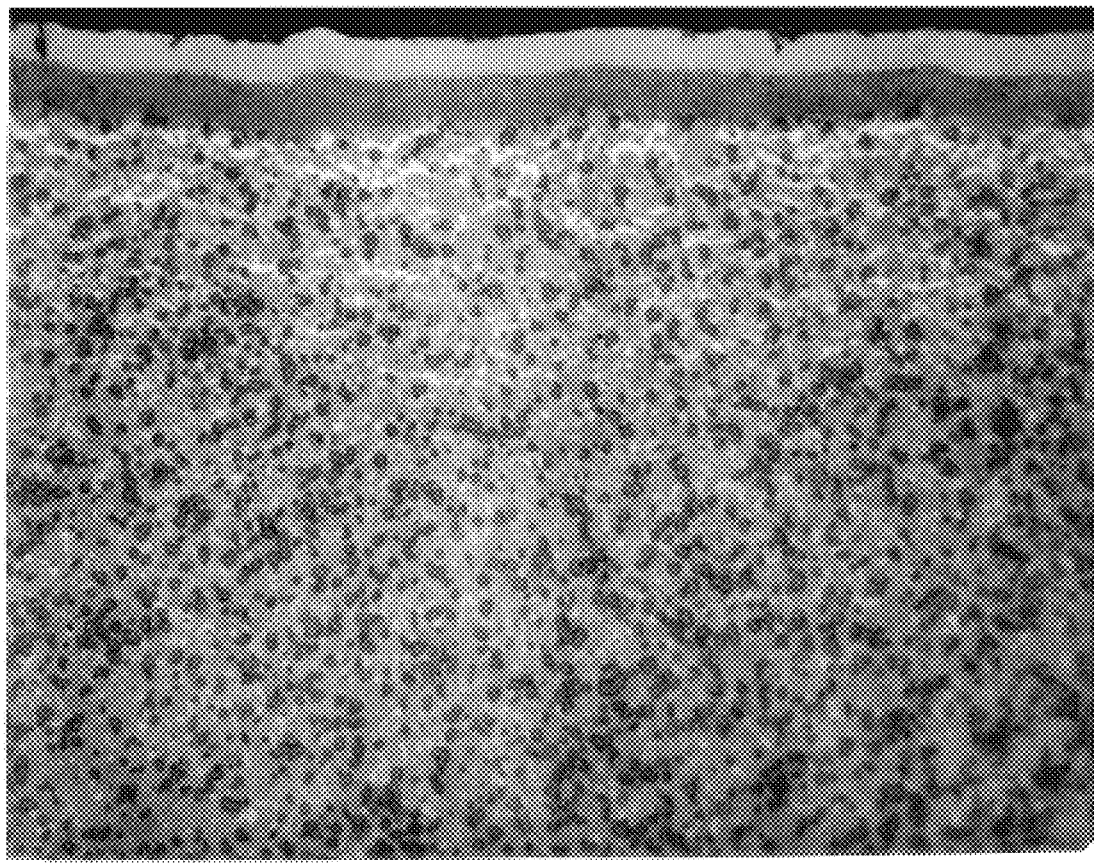
FIG. 1 is a photomicrograph of the titanium carbonitride coated stratified substrate of the present invention.

The structure of the cemented metal carbide substrate of the present invention is illustrated in the photomicrograph of FIG. 1. FIG. 1 depicts the relatively uniform alignment of cubic carbides of the stratified substrate. The uniform alignment of the cubic carbides presents a uniform surface upon which a titanium carbo-nitride layer may be deposited. The uppermost layer is the titanium nitride layer.

The cemented metal carbide substrate consists essentially of metal carbide particles in an amount from about 70 to about 97 percent by weight dispersed throughout a matrix of binder material which is present in an amount from about 3 to 30 percent by weight. Typical metal carbides are of tungsten, molybdenum, niobium (columbrium), tantalum, titanium, zirconium, vanadium, and hafnium. In the tungsten carbide based cement cutting inserts of the present invention, the hard refractory metal carbide employed comprises at least a major portion by weight tungsten carbide. Preferably, tungsten carbide is employed in an amount greater than 60%, more preferably greater than about 70% by weight of the metal refractory carbide. Due to excellent wettability with binders, tungsten carbide is preferably used in its hexagonal form. The most common additional carbides are those of titanium carbide, (W,Ti)C, and other GROUP IV element carbides with nitrogen content in 0.02–0.8 weight percent range. A principle purpose of additional carbides is to reduce the mean grain size of the tungsten carbide grains. The additional carbides tend to dissolve in a cobalt rich binder and impede the growth tungsten carbide grains during sintering. Preferably the starting powder of grains of metal carbide used have a mesh size of less than 200 mesh, U.S. standard screen size. This results in particle sizes less than approximately 10 microns.

The matrix binder materials employed for the substrate are preferably the iron group metals comprising cobalt, nickel, and iron, most preferably cobalt. Cobalt is preferred for use with tungsten carbide based alloys of the present invention due to excellent wettability. Cobalt preferably comprises greater than about 3% by weight of the binder in matrix material and preferably more than 4% by weight. Other materials may be alloyed with the cobalt matrix binder material provided the desirable final properties are not unduly affected. In addition to nickel and iron mentioned above, additional ingredients include molybdenum, tungsten or other metals.

The apparatus used in the process of the present invention comprises an enclosed vessel of stainless steel or other suitable material having a removable top or bottom cover. The cover is attached to the reaction vessel by suitable means such as bolts, clamps, hinges, or other means. The vessel is provided with an inlet and an outlet whereby the inlet gaseous mixture flows through a reaction zone containing the substrate to be coated and exits through an outlet. Typically the vessel includes a premix chamber where the gases utilized are premixed at a temperature lower than the reaction temperature. Uniformly mixed gases exiting the premix chamber flow into the inlet to the reaction zone.

The cemented carbide substrates or inserts are positioned in the reaction zone by conventional means such as by a rotatable table, trays, hooks, hangers, or other fixture known in the art. The vessel includes heating elements typically in the form of graphite heating rods. The reaction vessel is loaded with the inserts to be coated and typically flushed with a suitable insert gas such as nitrogen, argon, or the like prior to the introduction of the gaseous reactants.

The layer of titanium carbonitride is chemically vapor deposited on the inserts from a flowing mixture consisting essentially of gaseous reactants and inert gas. The deposition reaction is continued until the thickness of TiCN is a least approximately 3 microns and, more preferably, at least approximately 6 microns. The reaction proceeds according to the following formula:

$$TiCl_4 + 1/2 H_2 \rightarrow TiCl_3 + HCl$$

$$TiCl_4 + H_2 \rightarrow TiCl_2 + 2HCl$$

$$TiCl_4 + CH_4 + 1/2 N_2 \rightarrow TiCN + 4HCl$$

Carbon contained in the substrate may be an additional source of carbon. The reaction of TiCN with the substrate can be represented by the following equations:

$$2TiCl_4 + 3WC + N_2 + 3Co + 4H_2 \rightarrow 2TiCN + Co_3W_3C + 8HCl \quad (1)$$

$$2TiCl_3 + 3WC + N_2 + 3Co + 3H_2 \rightarrow 2TiCN + Co_3W_3C + 6HCl \quad (2)$$

$$5TiCl_3 + 6WC + 5/2 N_2 + 6Co + 15/2 H_2 \rightarrow 5TiCN + Co_6W_6C + 15HCl \quad (3)$$

The reaction products containing cobalt are eta phase substrates which cause embrittlement at the coating/substrate interface. The reactant gases are passed over the inserts in the reaction zone. The temperature of the reaction zone and of the substrate surface as well as the total flow and composition of the gas phase over the substrate are so selected as to allow the reaction between the gas and the substrate surface to proceed according to the thermodynamic principles. The total flow conditions and the total gas pressure are so selected as to allow the products of the reaction to be removed continuously from the reaction zone.

The fine grain size of the coating of the present invention has a porosity-free structure as observed through an optical microscope. The fine grain size of the present invention is preferably less than approximately 1 micron. Fine grained coated inserts normally show better wear resistance than those having a relatively coarse grain size.

It is known that the decarburization of a cemented carbide substrate results in the occurrence of brittle zones of eta phase at the coating/substrate interface. The eta phase is a ternary compound of cobalt, tungsten, and carbon, with a composition of the type of $Co_xW_yC$ where $x+y=6$ and/or 12, and x and y have values in the range of 2 to 6.

According to some reports in the literature, this phase is considered to be advantageous in cemented carbide because of alleged improvements in adhesion and wear resistance of the coating. In the present invention it is desirable to remove the eta phase due to its inherent brittle nature and the internal stresses and porosity caused when this compound is formed. The eta phase can cause cracks and shrinkage porosity which can result in premature failure of the insert under cutting conditions. In accordance with the principles of the present invention, the substrate directly adjacent the layer of titanium carbonitride comprises tungsten carbide in a form chemically unreacted with cobalt.

According to the carburizing process, the titanium carbonitride coated substrate is contacted with a hydrocarbon carburizing gas under suitable conditions to dissociate the gas, diffuse carbon formed during the disassociation through the coating and into the substrate, and react the carbon with eta phase present in the substrate to form tungsten carbide and cobalt. In addition, the carburizing gas reacts with eta phase to form elemental tungsten which diffuses into the TiCN coating to form a (W,Ti)C solid solution interlayer. Preferably, the carburizing process is carried out under suitable conditions so that substantially all of the eta phase present in the substrate directly adjacent the coating is decomposed.

The hydrocarbon component of the gas typically has a chemical formula $C_nH_{2n}+2$ wherein n is from 1 to 4. The preferred carburizing gas is methane. The concentration of the carbon correction cycle for TiCN layer optimization is preferably maintained sufficiently high to permit carbon to be available to diffuse through the coating to react with the eta phase while sufficiently low to reduce the tendency for free carbon to deposit on the surface. The carbon correction cycle for TiCN layer composition optimization may be a mixture of ingredients with inert or gaseous reducing components mixed with the hydrocarbon component. When hydrogen is used as a diluent, the concentration of the hydrocarbon component is preferably from about 0.1 to about 2.0 volume percent. The most preferred concentration is from about 0.2 to about 1 percent. The additional ingredients may aid in pyrolysis of the hydrocarbon component and act to dilute and uniformly distribute the carbon flux in the furnace.

Preferably, the carbon correction cycle for TiCN layer composition optimization is carried out so that tungsten from the substrate diffuses into the titanium carbonitride coating to form an interfacial region consisting of tungsten, titanium carbonitride and carbon. The interface forms a portion of the coating directly adjacent the substrate. It is believed that the formation of the interface permits the coating to be more strongly bonded to the substrate. The thickness of this interface can be controlled by the carbon correction cycle parameters. Typically, the thickness of the interface is from about 0.5 to about 6 microns. Preferably the thickness of the interface is from about 0.8 to about 4 microns, with the most preferred range being about 1 to about 3 microns.

The temperature during the carbon correction cycle is preferably sufficiently high to pyrolyze the hydrocarbon component and diffuse carbon through the coating into the substrate, and to adjust the carbon composition in the TiCN layer. The temperature is selected to promote the diffusion of tungsten but inhibit diffusion of deleterious amounts of cobalt into the interface. Higher temperatures and longer carbon correction cycle times tend to increase the diffusion and thickness of the interface. Preferably, the substrate is at a temperature of from 900 to 1200 degrees centigrade and more preferably from 1000 to 1100 degrees centigrade.

The carbon correction cycle treatment should be continued for a sufficient period of time to permit diffusion of the carbon through the coating and into the interface region of the substrate. For titanium carbonitride coating having a thickness on the order of about 5 to about 15 microns, typical carbon correction cycle times vary from 10 to 60 minutes. To achieve substantially complete decomposition of the eta phase, inserts having lower magnetic saturation values require longer time for carbon correction than inserts having higher magnetic saturation values. The magnetic saturation value is an indication of carbon deficiency. Lower magnetic saturation values indicate higher carbon deficiency. More carbon deficient substrates require longer carburization times. At magnetic saturation values in the range of 125 to 145, carbon correction cycle times on the order of 30 to 60 minutes are sufficient. Higher magnetic saturation values require less time with times reduced to 10 to 30 minutes with magnetic saturation values over 145.

The following examples are set forth to illustrate various aspects of the present invention, and are not intended in any way to limit the scope of the invention described herein.

EXAMPLE 1

Cemented carbide inserts were loaded into the furnace. The furnace was then purged with a gaseous mixture comprising 75% hydrogen and 25% by weight nitrogen as the furnace was heated to the operating temperature. When the operating temperature of 1050° C. was reached, the gas flow was maintained for 15 minutes and then adjusted for the deposition reaction. The gaseous mixture for titanium carbonitride deposition contained 90% by volume hydrogen, 3% by volume methane, 1.0% by volume $TiCl_4$ and 1% volume nitrogen. The gaseous ingredients were first metered into a premixing chamber which was maintained at a temperature of 900° C. the mixed gases then flowed into the reaction zone. The coating process was carried out for 115 minutes, and TiCN coating having a thickness from approximately 4 to approximately 6 microns was deposited. The eta phase which was present as a discontinuous layer had a thickness at the interface up to 2–3 microns. The insert as prepared in the above manner was carburized by heating the furnace to a temperature of 1150 degrees centigrade, and introducing a hydrogen and methane gaseous mixture into the reaction chamber. The mixture contained about 0.75 volume percent methane. The carburizing treatment was carried out for about 30 minutes.

The titanium carbonitride coated substrate body produced by the methods of the Example given above may be coated with additional layers of refractory material by chemical vapor deposition techniques or physical vapor deposition techniques known in the art. For example, the preferred intermediate coatings of titanium nitride, hafnium nitride, hafnium carbide or hafnium carbonitride and alumina, or even additional layers of titanium carbide may be applied by chemical vapor deposition. Other refractory materials may be applied by chemical vapor deposition. Other refractory materials may be applied by chemical vapor deposition. Other refractory materials may be applied by chemical vapor deposition techniques where such techniques are applicable, or by physical vapor deposition techniques such as direct evaporation, sputtering, etc.

Useful characteristics of the chemical vapor deposition method were the purity of the deposited layer and the tendency for some diffusional interaction between the layer being deposited and the substrate during early stages of the deposition process which leads to good layer adherence.

EXAMPLE 2

Titanium nitride intermediate coating layers and outer coating layers were formed on the titanium carbonitride coated substrate or on the intermediate coating layers of cutting tools of this invention by passing a gaseous mixture of titanium tetrachloride, a gaseous nitrogen source such as nitrogen or ammonia, and hydrogen over the substrate at a temperature of between about 800° C. and 1500° C., preferably at temperatures above about 1000° C. The reaction is described by the following equation; hydrogen was added to insure that the reaction takes place in a reducing environment;

$$2TiCl_4+N_2+4H_2 \rightarrow 2TiN+8HCl$$

EXAMPLE 3

Titanium carbide intermediate coating layers or outer coating layers were formed on the titanium carbonitride coated substrates or on the intermediate coating layers of cutting tools of this invention by passing a gaseous mixture of titanium tetrachloride, a gaseous carbon source such as methane, and hydrogen over the substrate at a temperature of between about 800° C. and 1500° C., preferably at temperatures above 1000° C. The reaction is described by the following equation, although hydrogen was often added to insure that the reaction takes place in a reducing environment:

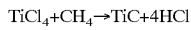

$$TiCl_4 + CH_4 \rightarrow TiC + 4HCl$$

In the titanium carbonitride coated carbide, control of the amounts of methane and nitrogen in the gas mixture permitted the formation of layers in which the ratio of x to y in the formula $(Ti(C_xN_y)$ were varied. The preferred values of x and y ranged between about 0.3 to about 0.6 for x and from about 0.7 to about 0.4 for y resulting in a preferred range of x/y ratio of from about 0.4 to about 1.5. The most preferred ratio of x to y was about 0.82, corresponding to values for x and y of about 0.45 to about 0.55, respectively.

EXAMPLE 4

Alumina intermediate coating layers or outer coating layers were formed on the titanium carbonitride coated substrate or intermediate coating layers of the cutting tools of this invention by chemical vapor deposition techniques or physical vapor deposition techniques or physical vapor deposition techniques known in the art. In one chemical vapor deposition technique, more fully described in U.S. Pat. No. 3,914,473 incorporated herein by reference as if fully set forth, vaporized aluminum chloride or other halide of aluminum passed over the heated coated substrate together with water vapor and hydrogen gas. Alternatively, the aluminum oxide was deposited by physical vapor deposition techniques such as direct evaporation or sputtering. The reaction for the chemical vapor deposition technique is described by the following equation, although hydrogen was often added to insure that the reaction takes place in a reducing atmosphere:

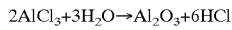

$$2AlCl_3 + 3H_2O \rightarrow Al_2O_3 + 6HCl$$

The substrate or coated substrate piece or pieces were heated to a temperature between about 800° C. to about 1500° C. in a furnace equipped for gaseous flow. The aluminum chloride supply was preheated to vaporize the material, and the aluminum chloride vapor was passed through the furnace, together with the other gases. The gas mixture was passed over the heated substrate or coated substrate until the desired coating thickness was achieved. Routine experimentation was used to determine the rate of coating thickness growth at a particular gaseous flow rate and temperature.

EXAMPLE 5

In another preferred method of coating the titanium carbonitride coated substrate bodies or the intermediate coatings with one or more adherent alumina coating layers, aluminum chloride was reacted with carbon dioxide in the presence of hydrogen gas according to the following equation:

$$2AlCl_3 + 3CO_2 \rightarrow Al_2O_3 + 3CO + 6HCl$$

Depending on the machining application and the work piece material, the combination of various coatings as described above could be tailored to enhance the overall tool performance. This was achieved through the combinations which lead to improved adherence of the coatings to the substrate and the coatings to coatings, and achieved by the improved structure/property of the coatings such as hardness, fracture toughness, impact resistance, chemical inertness, etc.

While there have been shown and described what are at present considered to be the preferred embodiments of the present invention, it will be appreciated that various changes and modifications may be made therein without departures from the spirit and scope of the invention as described in the appended claims.

I claim:

1. A titanium carbonitride coated cemented carbide article made according to a process comprising chemically vapor depositing a layer of titanium carbonitride directly on a cemented carbide substrate having a cobalt enriched surface by heating gaseous reactants comprising titanium chloride, methane, hydrogen and nitrogen with an optimum carbon/nitrogen ratio, under suitable conditions to form a titanium carbonitride coated cemented carbide article having an eta phase in the substrate adjacent said titanium carbonitride coating, said eta phase comprising chemical compounds consisting essentially of cobalt, tungsten and carbon, and contacting said coated article with a carburizing gas for a sufficient time and at sufficient temperature to convert substantially all of said eta phase to elemental cobalt and tungsten carbide, said article having a normalized and regular coating/substrate interface and an interfacial region consisting essentially of carbon, titanium carbonitride and tungsten in a form unreacted with cobalt.

2. The titanium carbonitride coated cemented carbide article of claim 1 wherein the cemented carbide substrate is at least partially stratified.

3. The titanium carbonitride coated cemented carbide article of claim 1 wherein the ratio of carbon to nitrogen of $TiC_xN_y$ is controlled, and wherein x is a number from about 0.3 to 0.6 and y is a number from about 0.7 to 0.4.

4. The titanium carbonitride coated cemented carbide article of claim 1 wherein distribution of cubic carbides at the coating/substrate interface is controlled.

5. The titanium carbonitride coated cemented carbide article of claim 1 wherein the titanium carbonitride coating has a grain size of approximately 1 $\mu$m.

6. The titanium carbonitride coated cemented carbide article of claim 1 further comprising at least one additional layer of refractory material deposited on the titanium carbonitride layer.

7. The titanium carbonitride coated cemented carbide article of claim 6 wherein the at least one additional layer of refractory material is selected from the group consisting of TiN, TiC, TiCN, HfN, HfC, HfCN, $Al_2O_3$ and mixtures thereof.

8. A titanium carbonitride coated cemented carbide cutting tool made according to a process comprising chemically vapor depositing a layer of titanium carbonitride on a cemented carbide substrate, having matrix binder material comprising cobalt, by heating gaseous reactants comprising titanium chloride, methane, hydrogen and nitrogen with an optimum carbon/nitrogen ratio, under suitable conditions to form a titanium carbonitride coated cemented carbide article having an eta phase in the substrate adjacent said titanium carbonitride coating, said eta phase comprising chemical compounds consisting essentially of cobalt, tungsten and carbon, and contacting said article with a carburizing gas for a sufficient time and at sufficient temperature to convert substantially all of said eta phase to elemental cobalt and tungsten carbide, said cutting tool having a uniform, fine grain, substantially porosity-free titanium carbonitride coating immediately adjacent said substrate, and an interfacial region having minimal cobalt and eta phase.

9. The titanium carbonitride coated cemented carbide cutting tool of claim 8 wherein the cemented carbide substrate comprises approximately 70–97 percent by weight metal carbide and approximately 3–30 percent by weight of a matrix binder material.

10. The titanium carbonitride coated cemented carbide cutting tool of claim 9 wherein said metal carbide comprises at least a major portion by weight tungsten carbide, the remainder of the metal carbide comprising carbides selected from the group consisting of Cr, Mo, V, Nb, Ta, Ti, Zr, Hf and mixtures thereof.

11. The titanium carbonitride coated cemented carbide cutting tool of claim 9 wherein said matrix binder material comprises approximately 3–100% by weight cobalt with the remainder of the binder material comprising metals selected from the group consisting of Ni, Fe, Mo, W and mixtures thereof.

12. The titanium carbonitride coated cemented carbide cutting tool of claim 8 wherein the cemented carbide substrate has a cobalt enriched surface.

13. The titanium carbonitride coated cemented carbide cutting tool of claim 8 wherein the cemented carbide substrate is at least partially stratified.

14. The titanium carbonitride coated cemented carbide cutting tool of claim 8 wherein the ratio of carbon to nitrogen of $TiC_xN_y$ is controlled, and wherein x is a number from about 0.3 to 0.6 and y is a number from about 0.7 to 0.4.

15. The titanium carbonitride coated cemented carbide cutting tool of claim 8 wherein distribution of cubic carbides at the coating/substrate interface is controlled.

16. The titanium carbonitride coated cemented carbide cutting tool of claim 8 wherein the titanium carbonitride coating has a grain size of approximately 1 $\mu$m.

17. The titanium carbonitride coated cemented carbide article of claim 8 further comprising an outer layer of a material selected from the group consisting of TiN, TiC, and $Al_2O_3$.

18. The titanium carbonitride coated cemented carbide article of claim 17 further comprising at least one additional coating layer, intermediate the outer layer and the titanium carbonitride coating adjacent the substrate, comprised of a material selected from the group consisting of $Al_2O_3$, TiN, TiC, TiCN, HfN, HfC, HfCN and mixtures of said nitrides, carbides and carbonitrides.

19. A wear resistant titanium carbonitride coated cemented carbide article comprising a cemented carbide substrate and at least one layer of titanium carbonitride coating, wherein said cemented carbide substrate comprises a cobalt enriched stratified surface and the layer of titanium carbonitride directly adjacent said substrate comprises an interfacial region consisting essentially of tungsten, titanium carbonitride and carbon whereby said coating is strongly bonded to the substrate.

20. The wear resistant titanium carbonitride coated cemented carbide article of claim 19 wherein the thickness of said interfacial region is from about 0.5 $\mu$m to about 6 $\mu$m.

21. A wear resistant titanium carbonitride coated cemented carbide article having a improved coating adherence comprising a cemented carbide substrate comprised of a hard refractory phase comprising tungsten carbide and a binder phase comprising cobalt, said substrate having a cobalt enriched surface, a layer of titanium carbonitride coating deposited directly upon said substrate, and a normalized and regular coating/substrate interface and an interfacial region proximate said interface being substantially free of eta phase.

22. A wear resistant titanium carbonitride coated cemented carbide article having a improved coating adherence comprising a cemented carbide substrate comprised of a hard refractory phase comprising tungsten carbide and a binder phase comprising cobalt, said substrate having a cobalt enriched surface, a layer of titanium carbonitride coating deposited directly upon said substrate, and an interfacial region therebetween consisting essentially of carbon, titanium carbonitride and tungsten, said coating having a solid solution interlayer of (W, Ti)C.

* * * * *